US006190953B1

(12) United States Patent
Igarashi et al.

(10) Patent No.: US 6,190,953 B1
(45) Date of Patent: Feb. 20, 2001

(54) SEMICONDUCTOR DEVICE AND METHOD FOR PRODUCING SAME

(75) Inventors: Wataru Igarashi; Yasuo Naruke, both of Yokohama (JP)

(73) Assignee: Kabushiki Kaisha Toshibia, Kawasaki (JP)

( * ) Notice: Under 35 U.S.C. 154(b), the term of this patent shall be extended for 0 days.

(21) Appl. No.: 09/438,767

(22) Filed: Nov. 12, 1999

Related U.S. Application Data

(62) Division of application No. 09/046,657, filed on Mar. 24, 1998, now Pat. No. 6,013,931.

(30) Foreign Application Priority Data

Mar. 25, 1997 (JP) .................................................. 9-070996

(51) Int. Cl.[7] .................................................. H01L 21/336
(52) U.S. Cl. ........................ 438/197; 438/233; 438/299
(58) Field of Search .................................... 438/197, 214, 438/233, 280, 283, 284, 299, 301

(56) References Cited

U.S. PATENT DOCUMENTS

| 4,945,070 | 7/1990 | Hsu . | |
|---|---|---|---|
| 5,151,376 | * 9/1992 | Spinner, III | 438/638 |
| 5,158,910 | * 10/1992 | Cooper et al. | 438/631 |
| 5,516,726 | * 5/1996 | Kim et al. | 438/662 |
| 5,693,975 | 12/1997 | Lien . | |
| 5,940,735 | * 8/1999 | Mehta et al. | 438/143 |

\* cited by examiner

Primary Examiner—Kevin M. Picardat
(74) Attorney, Agent, or Firm—Finnegan, Henderson, Farabow, Garrett & Dunner, L.L.P.

(57) ABSTRACT

A semiconductor device comprises: a semiconductor substrate; a field oxide film formed in the semiconductor substrate, the field oxide film having element forming regions on both sides thereof; a pair of MOS transistors formed in the element forming regions on both sides of the field oxide film, each of the transistors having a gate oxide film, a gate electrode and a pair of source/drain regions; an interlayer insulating film covering the semiconductor substrate, the field oxide film and the transistors; a local interconnect formed by embedding a conductive material in a first opening formed in the interlayer insulating film, the first opening being arranged above the field oxide film and having a greater width than the field oxide film, an inner one of the pair of source/drain regions of each of the pair of transistors being exposed to the first opening, the inner one of the pair of source/drain regions of one of the pair of transistors being electrically connected to the inner one of the pair of source/drain regions of the other of the pair of transistors by means of the local interconnect; and a pair of buried contacts formed by embedding a pair of conductive materials in a pair of second openings formed in the interlayer insulating film, the pair of second openings being arranged above an outer one of the pair of source/drain regions of each of the pair of transistors, the outer one of the pair of source/drain regions being exposed to the second openings.

8 Claims, 10 Drawing Sheets

SEMICONDUCTOR DEVICE AND METHOD FOR PRODUCING SAME

This is a division of application Ser. No. 09/046,657, filed Mar. 24, 1998, now U.S. Pat. No. 6,013,931, all of which are incorporated herein by reference.

BACKGROUND OF THE INVENTION

1. Field of the Invention

The present invention relates generally to a connector/connecting technique for semiconductor devices. More specifically, the invention relates to a connector/connecting technique for use in a semiconductor memory required to be highly integrated.

2. Description of the Background Art

Referring now to the accompanying drawings, the prior art will be described. In recent years, with the miniaturization of semiconductor chips, a local interconnect has beenused for connecting a gate electrode of a transistor to a diffusion layer. In particular, the local interconnect is effectively used for a semiconductor memory (SRAM) required to behighly integrated.

Referring to FIGS. 1A through 1D, a conventional method for forming a local interconnect and a contact will be described below.

First, as shown in FIG. 1A, a gate insulating film 3 and a gate electrode 4 are stacked on a semiconductor substrate 1. Then, as shown in FIG. 1B, the gate electrode 4 is used as a mask to form diffusion layers 2 serving as sources or drains on the semiconductor substrate 1 using the ion implantation. Subsequently, an interlayer insulating film 7 of silicon dioxide is formed on the whole surface using the CVD method. The interlayer insulating film 7 is deposited so as to have an elevation higher than that of the gate electrode 4. Then, as shown in FIG. 1C, the upper surface of the gate electrode 4 and the upper surfaces of one of the diffusion layers 2 are exposed toform an opening 7A by means of the photo-etching. Thereafter, as shown in FIG. 1D, an electrode material 9 is deposited on the inner surface of the opening 7A and the upper surface of the interlayer insulating film 7 using the sputtering or the like.

Then, as shown in FIG. 2A, the electrode material 9 on the interlayer insulating film 7 is removed by the CMP method. In the opening 7A, the gate electrode 4 is electrically connected to one of the diffusion layers 2 to form a local interconnect LIC. Subsequently, as shown in FIG. 2B, an interlayer insulating film 8 of silicon dioxide is deposited on the whole surface by the CVD method. Thereafter, as shown in FIG. 2C, a contact hole 10A is formed in the interlayer insulating films 7 and 8 so as to reach the diffusion layer 2 by means of the photo-etching. Subsequently, an electrode material 10 is embedded in the contact hole 10A, and an upper layer wiring 11 is formed thereon. By these steps, the local interconnect LIC and a contact CT are formed.

In a case where a local interconnect LIC and a contact CT are formed by the above described conventional method, the contact CT is formed (see FIGS. 2B through 2C) after the local interconnect LIC is formed (see FIGS. 1A through 2A). That is, the local interconnect structure and the contact are separately produced. Therefore, there is a problem in that the number of steps is high to complicate the manufacturing method and to increase the costs.

SUMMARY OF THE INVENTION

It is therefore an object of the present invention to eliminate the aforementioned problems and to provide a semiconductor device and a method for producing the same, which can prevent the increase of the number of steps of forming a local interconnect structure and a contact and which can provide simplified steps.

In order to accomplish the aforementioned and other objects, according to one aspect of the present invention, a semiconductor device comprises: a semiconductor substrate; a field oxide film formed in the semiconductor substrate, the field oxide film having element forming regions on both sides thereof; a pair of MOS transistors formed in the element forming regions on both sides of the field oxide film, each of the MOS transistors having a gate oxide film, a gate electrode and a pair of source/drain regions; an interlayer insulating film covering the semiconductor substrate, the field oxide film and the MOS transistors; a local interconnect formed by embedding a conductive material in a first opening formed in the interlayer insulating film, the first opening being arranged above the field oxide film and having a greater width than the field oxide film, an inner one of the pair of source/drain regions of each of the pair of MOS transistors being exposed to the first opening, the inner one of the pair of source/drain regions of one of the pair of MOS transistors being electrically connected to the inner one of the pair of source/drain regions of the other of the pair of MOS transistors by means of the local interconnect; and a pair of buried contacts formed by embedding a pair of conductive materials in a pair of second openings formed in the interlayer insulating film, the pair of second openings being arranged above an outer one of the pair of source/drain regions of each of the pair of MOS transistors, the outer one of the pair of source/drain regions being exposed to the second openings.

According to another aspect of the present invention, a semiconductor device comprises: a semiconductor substrate; a MOS transistor formed on the semiconductor substrate, the MOS transistor having a gate oxide film, a gate electrode and a pair of source/drain regions; an interlayer insulating film covering the semiconductor substrate and the MOS transistor; a local interconnect formed by embedding a conductive material in a first opening formed in the interlayer insulating film, part or all of the gate electrode and all or part of one of the source/drain regions being exposed to the first opening, the gate electrode being electrically connected to one of the source/drain regions by means of the local interconnect; a buried contact formed by forming a second opening in the interlayer insulating film, the surface of the semiconductor substrate being exposed to the second opening; a second insulating film covering the interlayer insulating film, the local interconnect and the buried contact so that the interlayer insulating film, the local interconnect and the buried contact are flush with each other; and a wiring formed by embedding a wiring material in a wiring embedding groove formed in the second insulating film, the buried contact being exposed to the groove.

According to further aspect of the present invention, a method for producing a semiconductor device, comprises the steps of: forming a MOS transistor on a semiconductor substrate so that the MOS transistor has a gate insulating film, a gate electrode and a pair of source/drain regions; forming an interlayer insulating film thereon; forming first and second openings in the interlayer insulating film so that both of the gate electrode and one of the source/drain regions are exposed by the first opening and the surface of the semiconductor substrate is exposed by the second opening; embedding conductive materials in the first and second openings of the interlayer insulating film; performing the etch back of the conductive materials so that the conductive materials in the first and second openings are level with the interlayer insulating film; forming a second insulating film thereon; forming a wiring embedding groove in the second insulating film; and embedding a wiring material in the groove.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the first preferred embodiment of the present invention will be described in detail below.

Figure 3A:
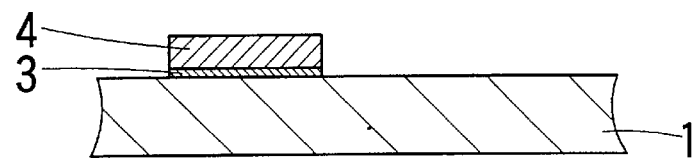
FIGS. 3A through 3D and 4A through 4E are sectional views illustrating a preferred embodiment of steps of producing a local interconnect and a contact according to the present invention.

As shown in FIG. 3A, a gate insulating film 3 of silicon dioxide having a thickness of about 10 nm and a gate electrode 4 of a polysilicon having a thickness of about 100 nm are stacked on a p-type semiconductor substrate 1.

Figure 3B:
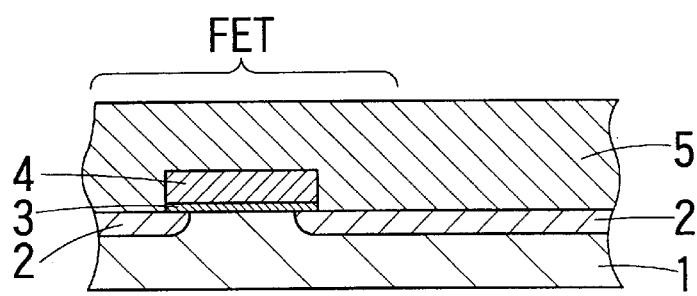

As shown in FIG. 3B, the gate electrode 4 is used as a mask to implant impurities (boron, phosphorus or the like) into the surface of the p-type semiconductor substrate 1 to form diffusion layers 2 serving as sources or drains. By these steps, a MOS transistor is formed. Moreover, an interlayer insulating film 5 of silicon dioxide having a thickness of tens nm is formed so as to cover the whole surface by the CVD method.

Figure 3C:
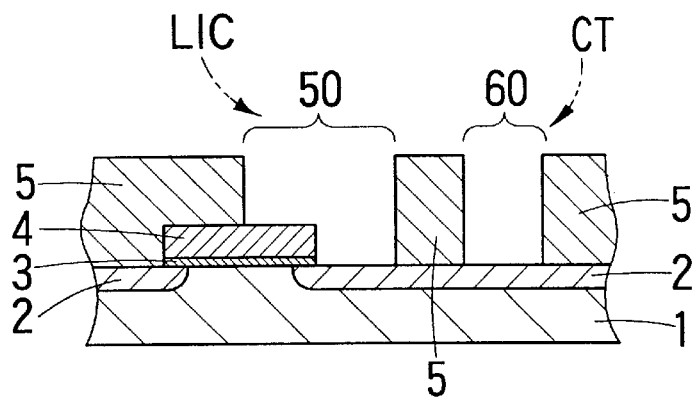

As shown in FIG. 3C, using the photo-etching, openings 50 and 60 are simultaneously formed by patterning the interlayer insulating film 5. The opening 50 is used for forming a local interconnect LIC, and the opening 60 is used for forming a contact CT. While the contact CT has been formed after forming the local interconnect LIC in the conventional method, the opening 50 used for forming the local interconnect and the opening 60 used for forming the contact are simultaneously formed according to the present invention. This is one of the features of the present invention.

Figure 3D:
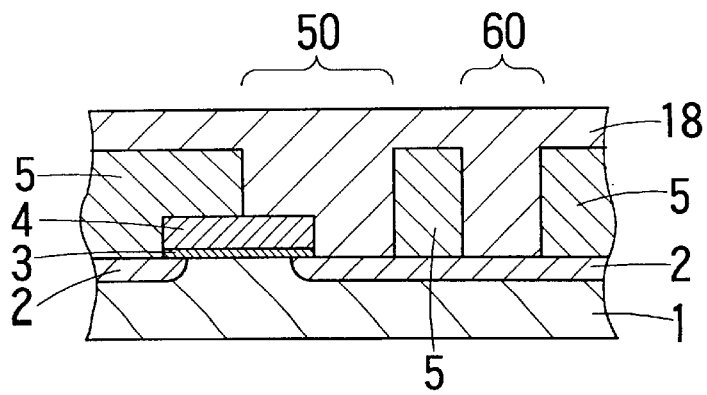

As shown in FIG. 3D, an electrode material (e.g., tungsten W) 18 is formed on the upper surface of the interlayer insulating film 5 by means of the sputtering so that the openings 50 and 60 are completely filled with the electrode material 18.

Figure 4A:
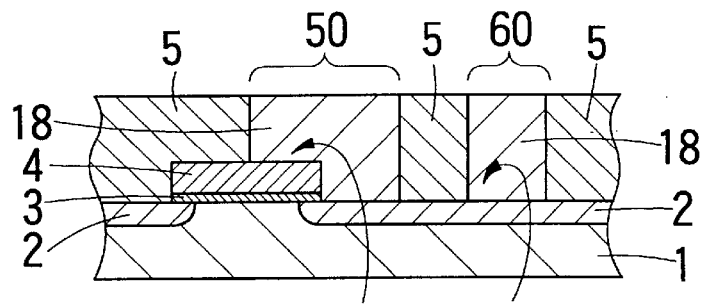

Thereafter, as shown in FIG. 4A, the etch back of the electrode material 18 is carried out by the CMP method or the like until the upper surface of the interlayer insulating film 5 is exposed. Thus, the electrode material 8 can remain only in the openings 50 and 60. In the opening 50, the gate electrode 4 is electrically connected to the diffusion layer 2, so that a local interconnect LIC is formed. In the opening 60, a contact CT reaching the diffusion layer 2 is formed.

Figure 4B:
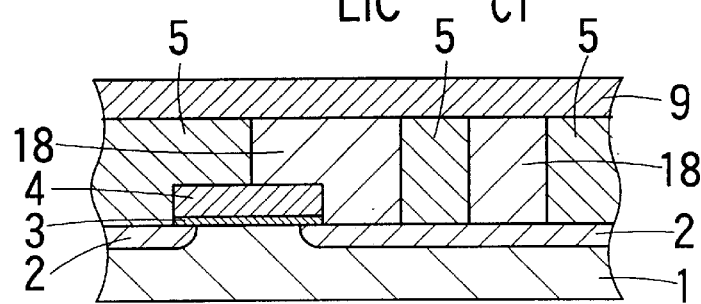

As shown in FIG. 4B, an insulating film 9 of silicon dioxide having a thickness of tens nm is formed on the upper surfaces of the interlayer insulating film 5 and the wiring material 8 by the CVD method.

Figure 4C:
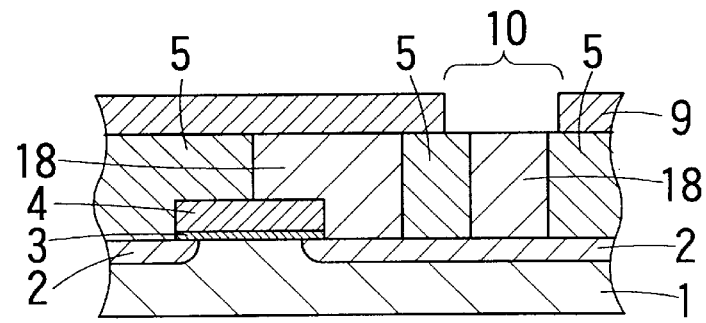
Figure 4D:
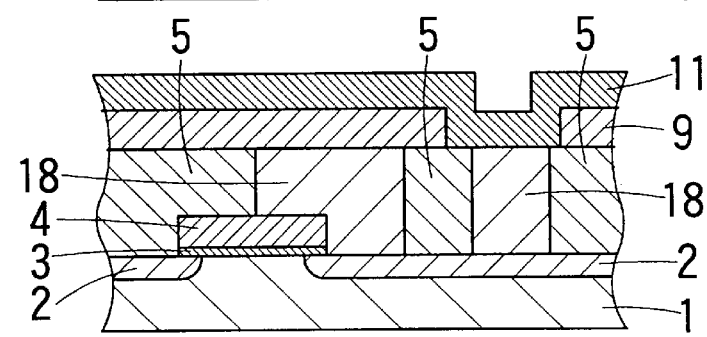
Figure 4E:
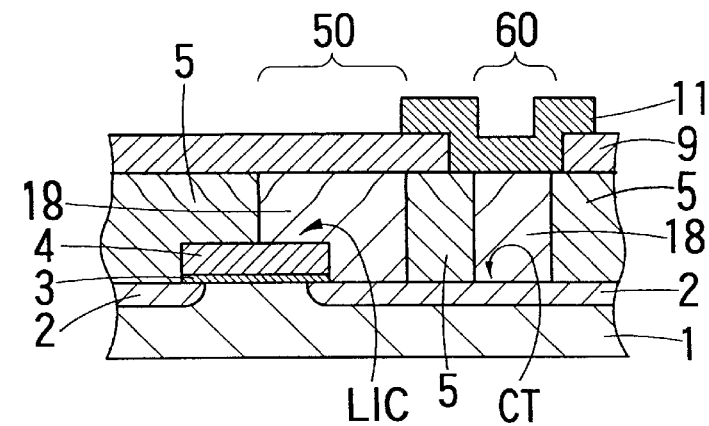

Then, as shown in FIG. 4C, an opening 10 is formed in the insulating film 9 by means of the photo-etching, and as shown in FIG. 4D, a wiring material 11 (e.g., a metal wiring of aluminum) is formed by means of the sputtering to be patterned as shown in FIG. 4E. Thus, a semiconductor device of the present invention is formed.

In the above preferred embodiment, the wiring material 18 embedded in the opening 50 used for forming the local interconnect has been the same material as that embedded in the opening 60 used for the forming the contact, different materials may be embedded.

Figure 5A:
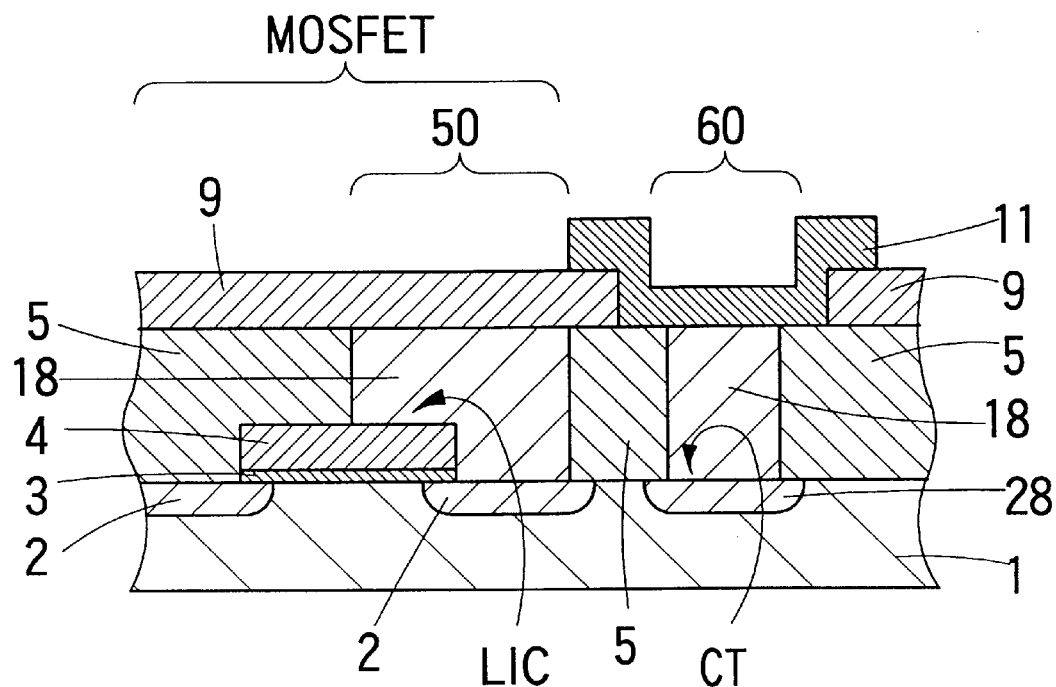
FIGS. 5A and 5B are sectional views illustrating another preferred embodiment of a local interconnect and a contact according to the present invention.

In addition, as shown in FIG. 5A, a diffusion layer 2 of a MOS transistor may be separated from a diffusion layer 28, to which a contact 18 extends.

Figure 5B:
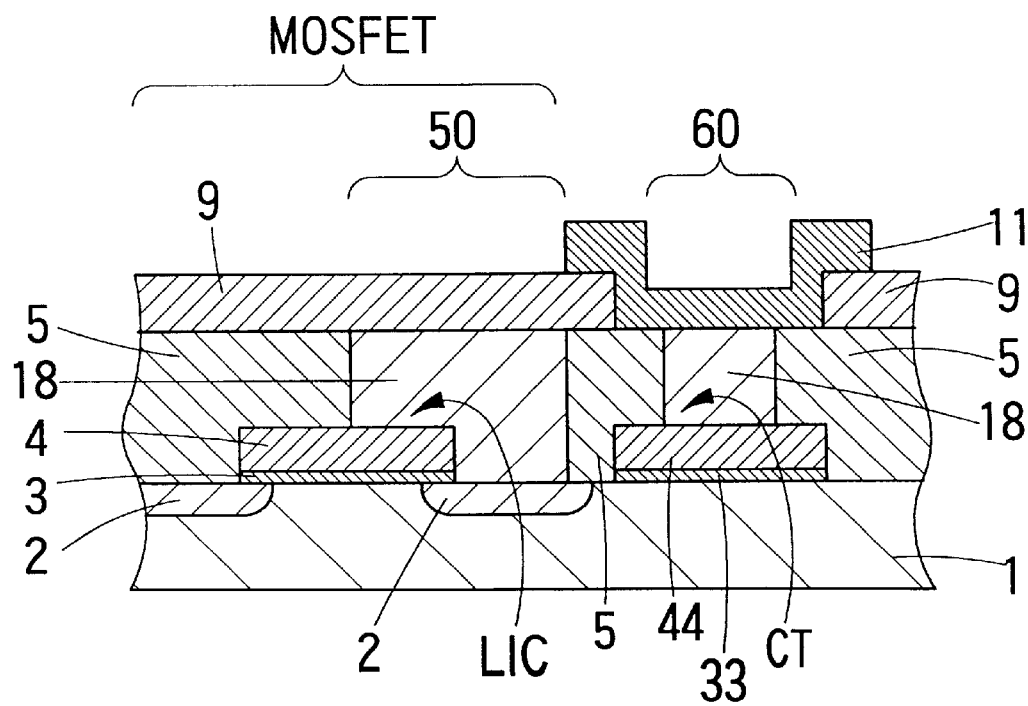

Moreover, as shown in FIG. 5B, a contact 18 may reach an electrode having a laminated structure of an insulating film 33 and a gate electrode 44.

Figure 1A:
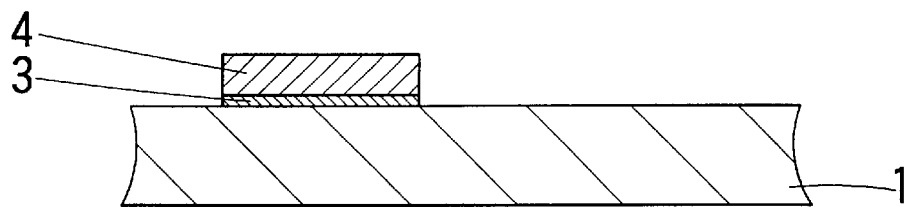
FIGS. 1A through 1D and 2A through 2C are sectional views illustrating conventional steps of producing a local interconnect and a contact.
Figure 1B:
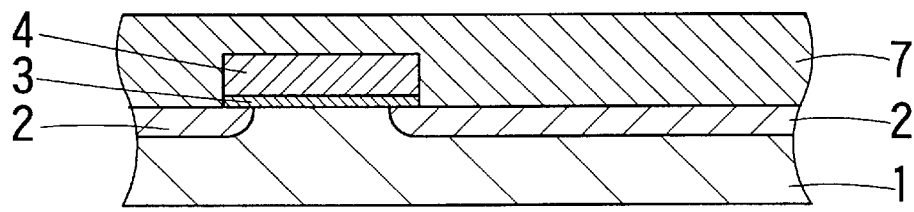
Figure 1C:
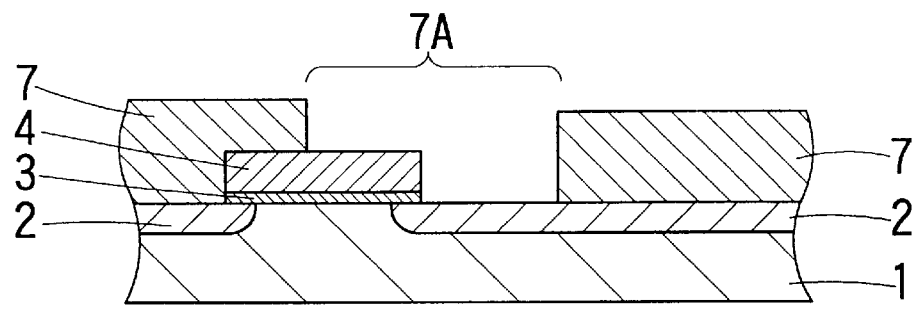
Figure 1D:
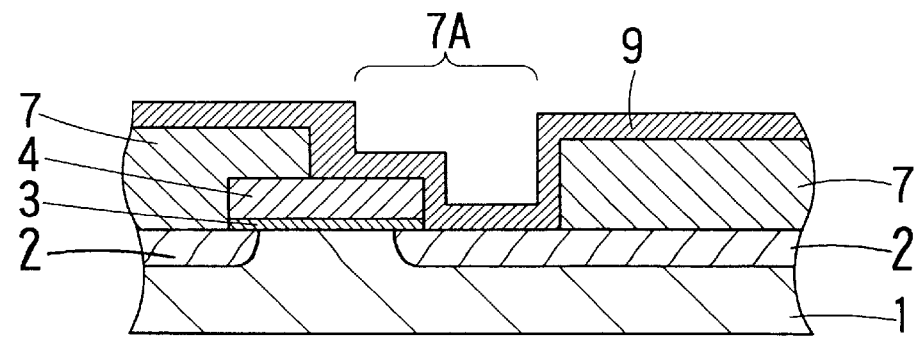
Figure 2A:
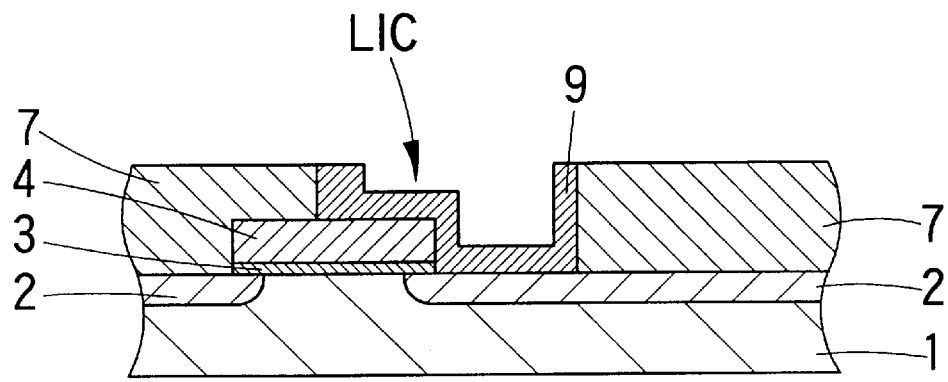
Figure 2B:
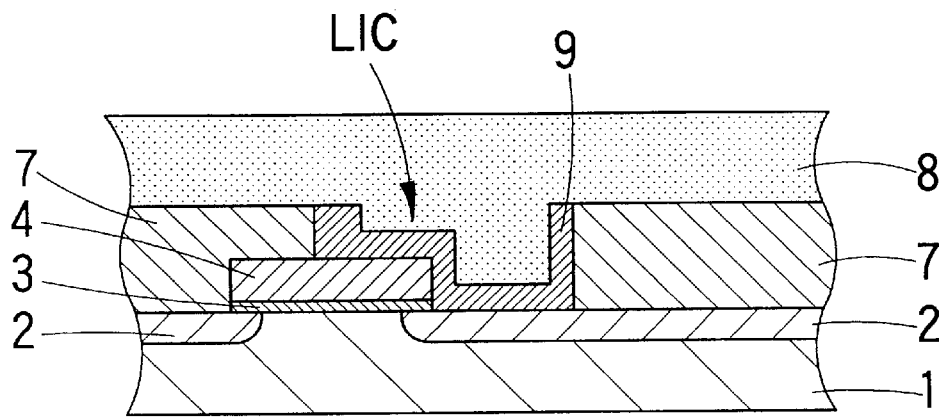
Figure 2C:
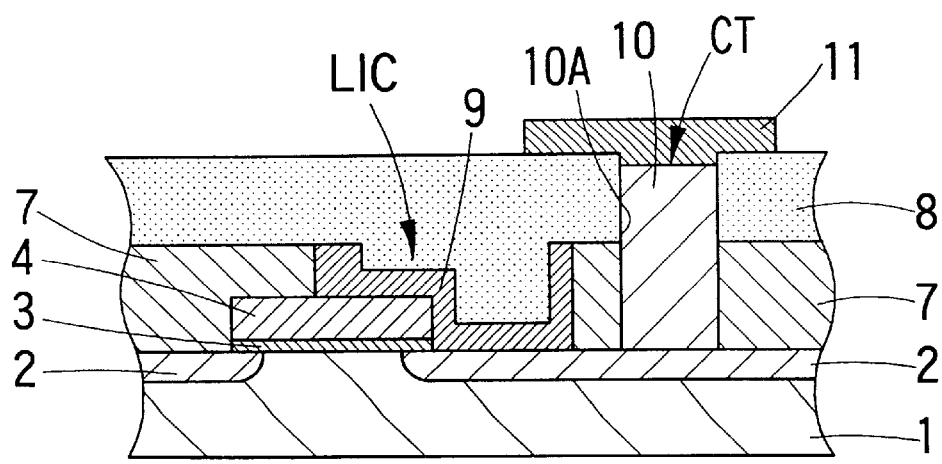

With this construction, according to the above preferred embodiment of the present invention, it is possible to simultaneously form the local interconnect and the contact. Therefore, it is not required to form an interlayer insulating film (the interlayer insulating film 8 in FIG. 2B), which is formed after forming the local interconnect by the conventional method, so that it is possible to decrease the number of steps in the manufacturing process.

In the conventional method, since the opening for the local interconnect and the opening for the contact are separately formed, the openings must be apart from each other at regular intervals so as to prevent the openings from being overlapped with each other due to non-aligned mask and so forth. On the other hand, according to this preferred embodiment of the present invention, since the openings are simultaneously formed, both openings are not overlapped, so that it is possible to miniaturize semiconductor chips.

Since the conventional local interconnect has irregularities, the interlayer insulating film 8 (see FIG. 2B) formed thereon is not flat, so that the number of steps must be increased to make the interlayer insulating film 8 flat. On the other hand, according to this preferred embodiment of the present invention, since the upper surface of the local interconnect is flat, the layer and wiring formed thereon can be flat, so that the step of removing the difference in level can be omitted.

In addition, e.g., as shown in FIG. 4B, the electrode material 18 embedded in the opening 50 and the electrode material 18 embedded in the opening 60 have the same elevation on the surface of the interlayer insulating film 5. Therefore, according to the present invention, it is possible to sufficiently insulate the wiring material 11 from the electrode material 18 embedded in the opening 50, by providing the insulating film 9.

While the gate electrode of the transistor has been electrically connected to the source/drain diffusion layer by means of the local interconnect, other elements of a semiconductor device may be connected to each other by means of the local interconnect.

Figure 6A:
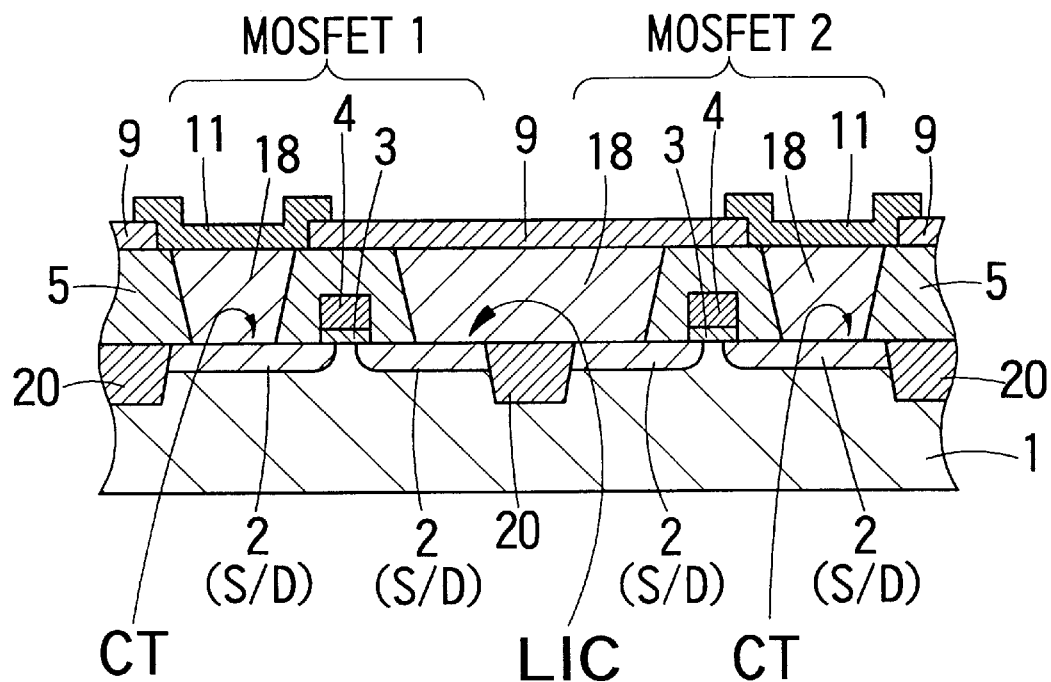
FIGS. 6A and 6B are sectional views illustrating another preferred embodiment of a local interconnect and a contact according to the present invention.

FIG. 6A shows an example of sources/drains of two adjacent MOSFETs electrically connected to each other by means of a local interconnect. Specifically, in FIG. 6A, MOSFETs are formed in element forming regions divided by field oxide films 20, and the sources/drains of the MOSFETs are connected by means of the local interconnect. In FIG. 6A, the same reference numbers are used for the same elements as those in FIGS. 5A and 5B, so that the detailed descriptions thereof are omitted. The field oxide films 20 are formed on a semiconductor substrate 1, and MOSFETs 1, 2 are formed in the element forming regions divided by the field oxide films 20. That is, a gate electrode 4 is formed on each of gate insulating films 3, and diffusion layers 2 serving as sources/drains are formed on both sides thereof. Then, interlayer insulating films 5 are formed thereon, and openings are formed by means of the patterning. Then, electrode materials 18 are embedded in the openings. The etch back of the electrode materials 18 is carried out so that the electrode materials 18 in the respective openings are flush with each other as shown in FIG. 6A. Subsequently, an insulating film 9 is deposited thereon, and openings are formed by means of the patterning. Then, wiring materials 11 are embedded in the openings, and the patterning is carried out to obtain a semiconductor device of FIG. 6A.

Figure 6B:
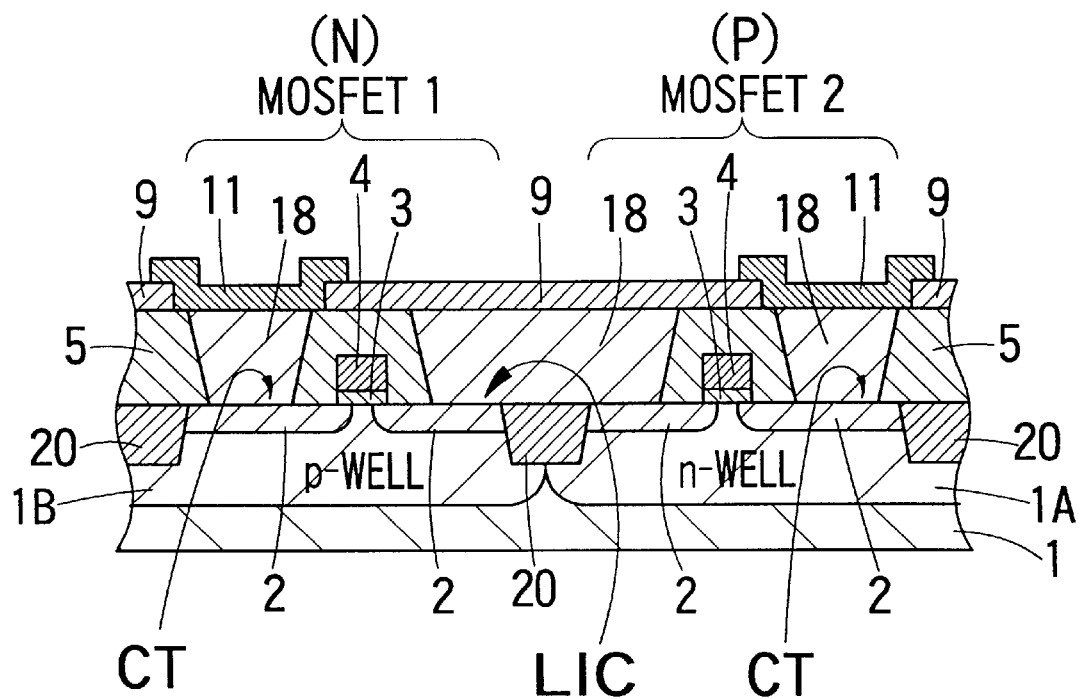
Figure 7A:
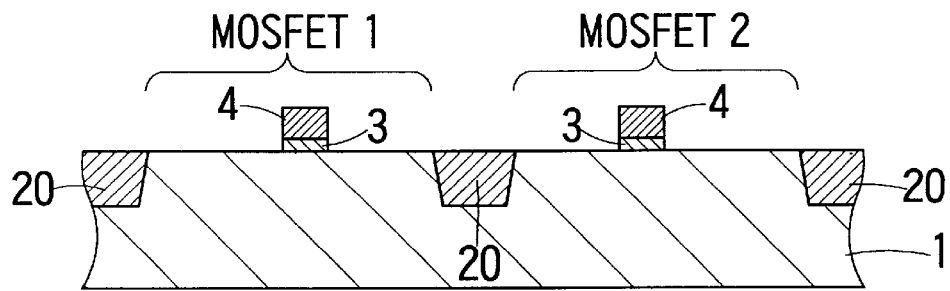
FIGS. 7A through 7G are sectional views illustrating a preferred embodiment of steps of producing the device shown in FIG. 6A.
Figure 7B:
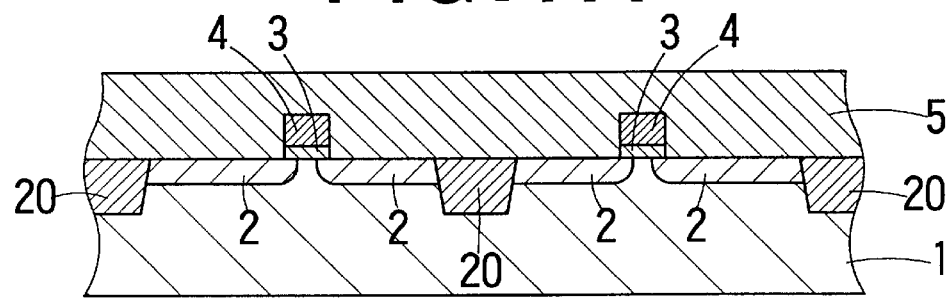
Figure 7C:
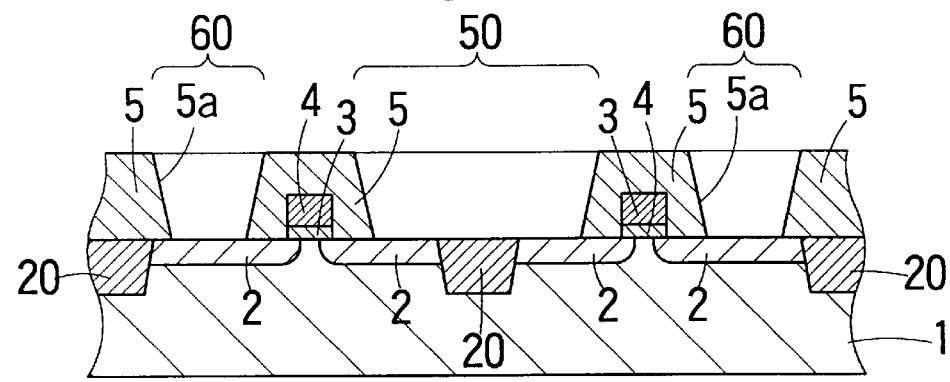
Figure 7D:
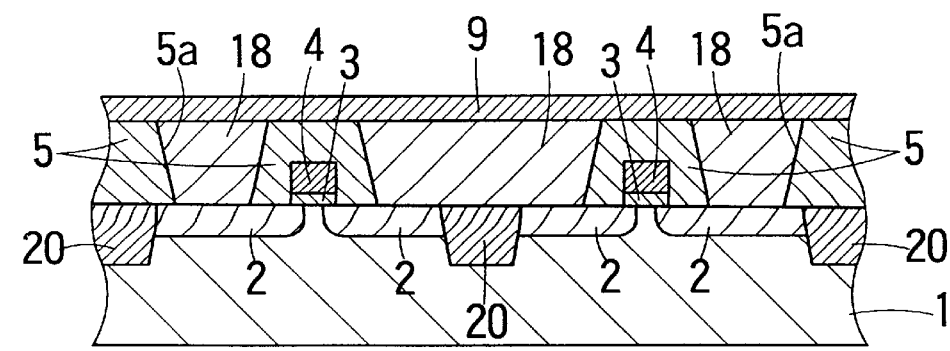
Figure 7E:
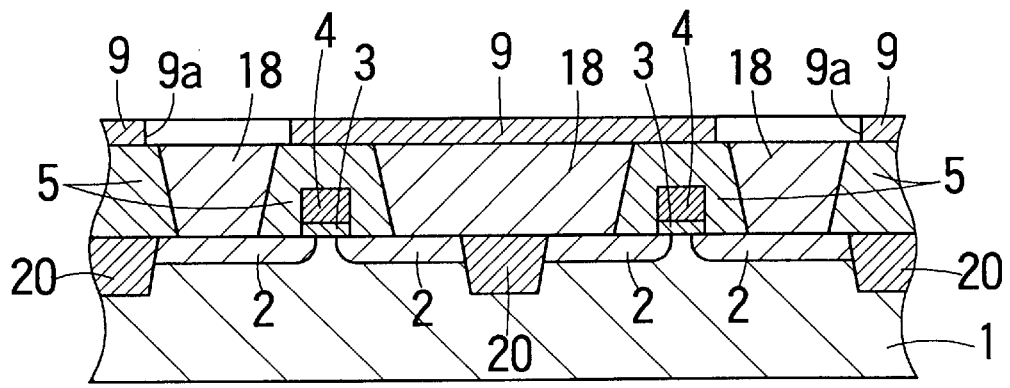
Figure 7F:
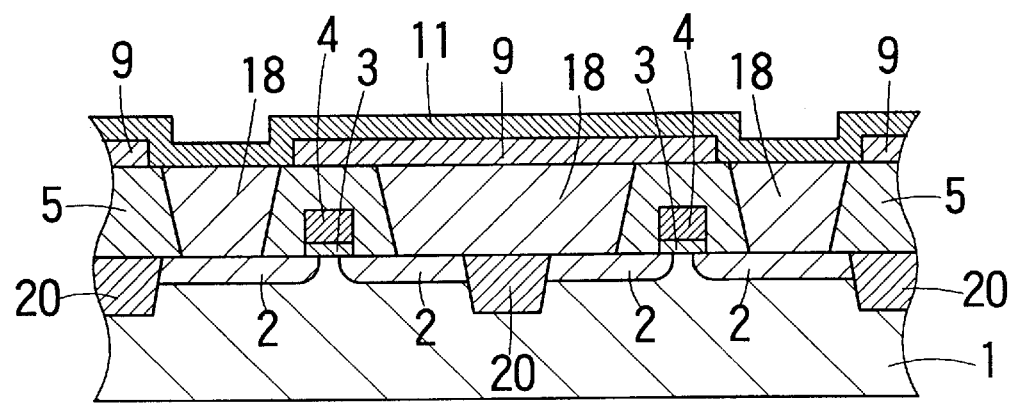
Figure 7G:
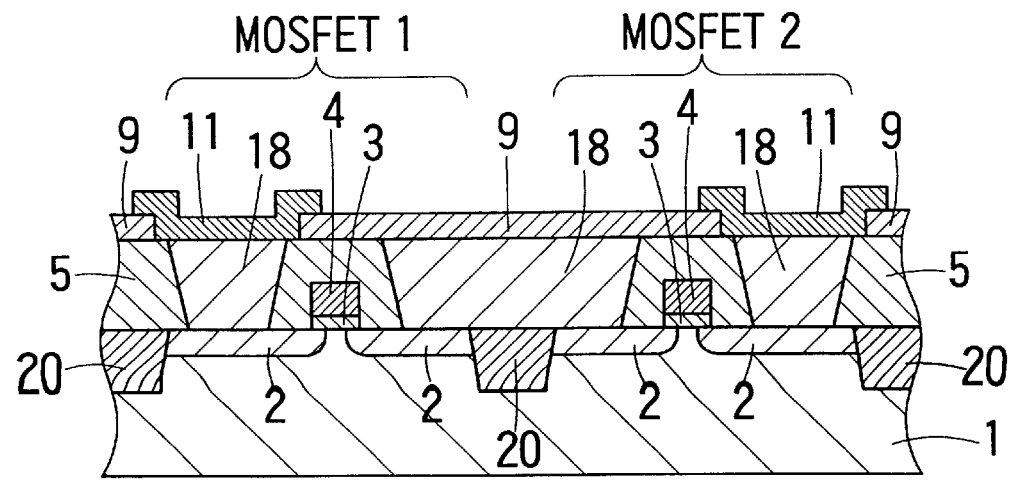
Figure 8A:
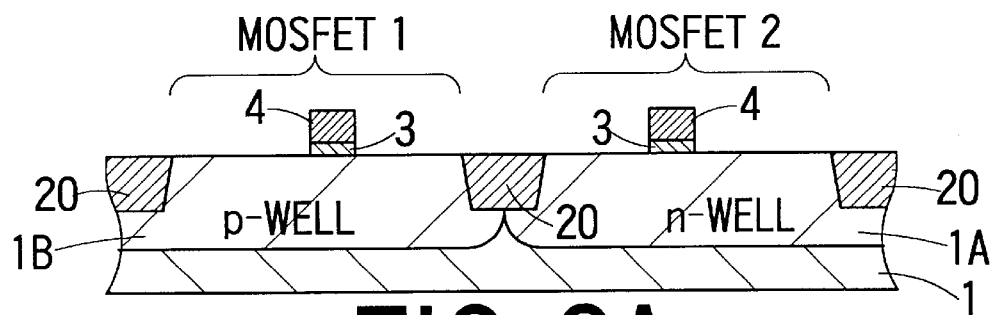
FIGS. 8A through 8G are sectional views illustrating a preferred embodiment of steps of producing the device shown in FIG. 6B.
Figure 8B:
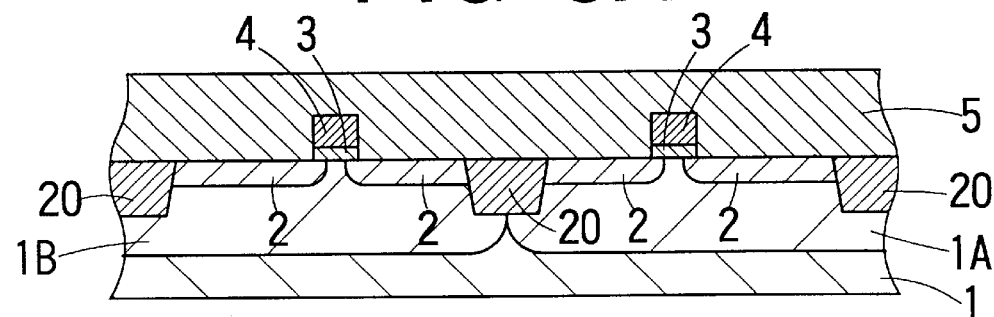
Figure 8C:
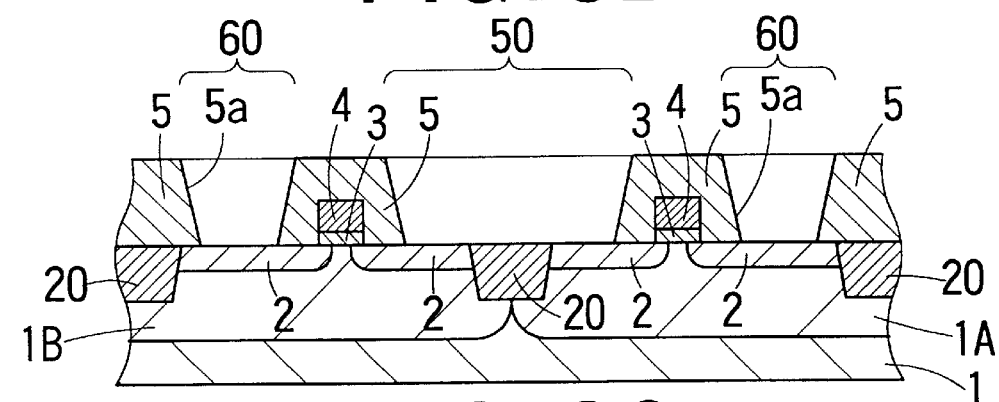
Figure 8D:
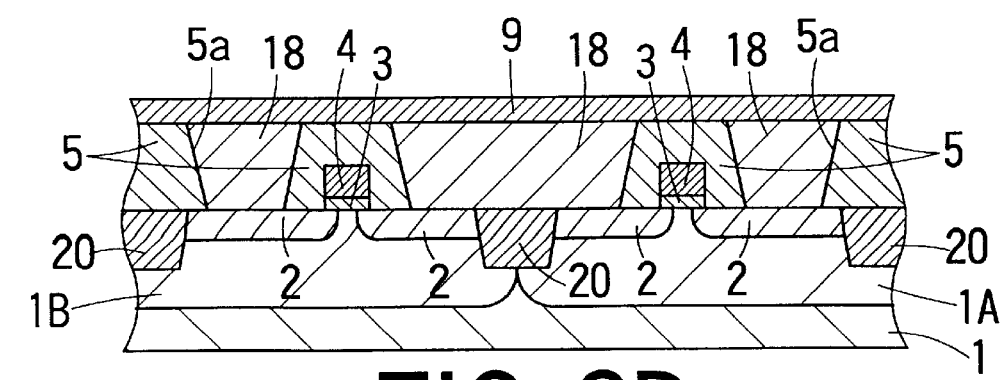
Figure 8E:
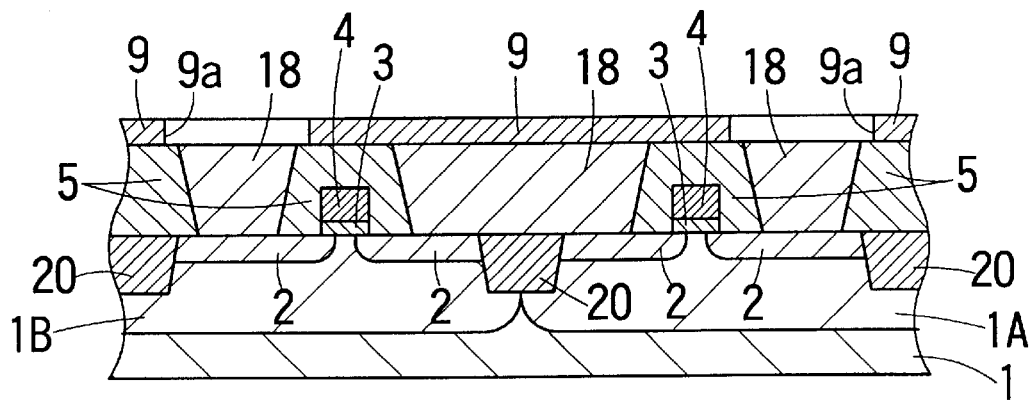
Figure 8F:
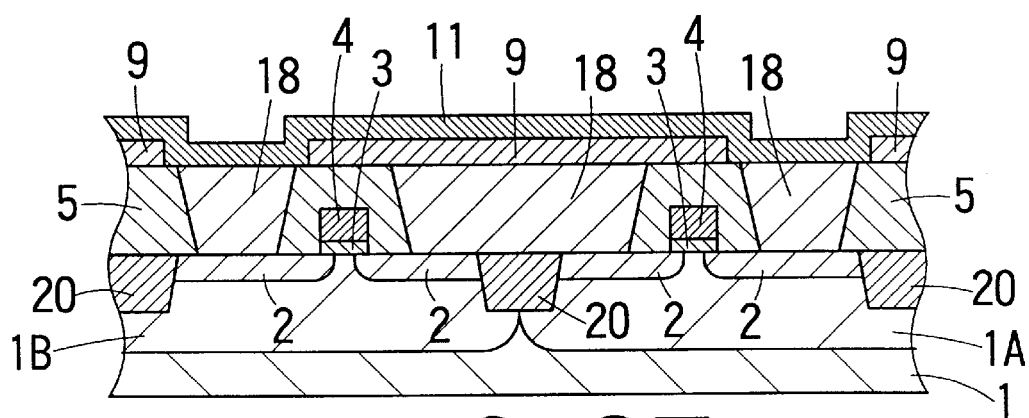
Figure 8G:
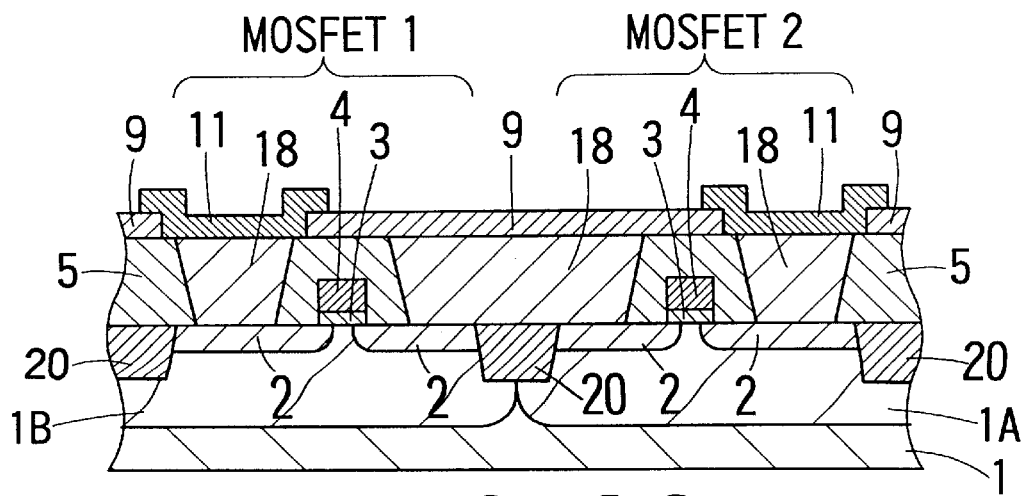

FIG. 6B shows a semiconductor device having substantially the same structure as that of FIG. 6A, except that the MOSFETs 1, 2 are formed as NMOS and PMOS, i.e., an n well 1A and a p well 1B are formed on a semiconductor substrate 1 and a FET is formed therein.

FIGS. 7A–7G and FIGS. 8A–8G are sectional views illustrating preferred embodiments of steps of producing the semiconductor devices shown in FIGS. 6A and 6B, respectively. Detail explanations for these figures are omitted, because a person skilled in the art may easily know about them from FIGS. 3A–3D and 4A–4D.

According to the present invention, since it is possible to simultaneously form an interconnect structure and a contact, it is possible to prevent the increase of the number of steps and to simplify the manufacturing process.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a semiconductor device, said method comprising the steps of:
    forming a MOS transistor on a semiconductor substrate so that said MOS transistor has a gate insulating film, a gate electrode and a pair of source/drain regions;
    forming an interlayer insulating film thereon;
    forming first and second openings in said interlayer insulating film so that both of said gate electrode and one of said source/drain regions are exposed by said first opening and the surface of said semiconductor substrate is exposed by said second opening;
    embedding conductive materials in said first and second openings of said interlayer insulating film;
    performing the etch back of said conductive materials so that said conductive materials in said first and second openings are level with said interlayer insulating film;
    forming a second insulating film thereon;
    forming a wiring embedding groove in said second insulating film; and
    embedding a wiring material in said groove.

2. A method as set forth in claim 1, wherein, in said step of forming first and second openings, said second opening is formed so that said one of said source/drain regions is exposed.

3. A method as set forth in claim 1, wherein, in said step of forming first and second openings, said second opening is formed so that a diffusion layer which is not electrically connected to said one of said source/drain regions is exposed.

4. A method as set forth in claim 1, wherein, in said step of forming first and second openings, said second opening is formed so that an upper electrode are exposed, and said upper electrode and a lower insulating film being formed on said semiconductor substrate so as to have a lamination structure.

5. A method for producing a semiconductor device, said method comprising the steps of:
    forming a pair of MOS transistors on a semiconductor substrate on both sides of a field oxide film so that each of said transistors has a gate insulating film, a gate electrode and a pair of source/drain regions;
    forming an interlayer insulating film thereon;
    forming first and second openings in said interlayer insulating film so that said first opening is arranged above said field oxide film to allow both of said pair of facing source/drain regions of said pair of transistors to be exposed and said second opening allows an outer one of said source/drain regions of each of said pair of transistors to be exposed;
    embedding conductive materials in said first and second openings of said interlayer insulating film;
    performing the etch back of said conductive materials so that said conductive materials in said first and second openings are level with said interlayer insulating film;
    forming a second insulating film thereon;
    forming a wiring embedding groove in said second insulating film; and
    embedding a wiring material in said groove.

6. A method as set forth in claim 5, which further comprises, before said step of forming the pair of MOS transistors, a step of forming p and n wells in a surface portion of said semiconductor substrate on both sides of said field oxide film to form said pair of transistors in said wells.

7. A method for producing a semiconductor device, said method comprising the steps of:
    forming a MOS transistor on a semiconductor substrate so that said MOS transistor has first and second diffusion layers serving as sources or drains and a gate electrode which is formed so as to be adjacent said first and second diffusion layers;
    forming an interlayer insulating film on said semiconductor substrate and said MOS transistor so as to have an elevation higher than that of said gate electrode;
    forming a first opening in said interlayer insulating film for exposing the surface of said first diffusion layer and the surface of said gate electrode, and simultaneously forming a second opening reaching said first diffusion layer; and forming electrode materials in said first and second openings.

8. A method for producing a semiconductor device as set forth in claim 7, said method further comprising the steps of:

forming a third opening in said first insulating film, said third opening reaching said electrode material formed in said second opening; and forming a wiring by embedding a wiring material at least in said third opening.

* * * * *

UNITED STATES PATENT AND TRADEMARK OFFICE
CERTIFICATE OF CORRECTION

PATENT NO.     : 6,190,953 B1
DATED          : February 20, 2001
INVENTOR(S)    : Igarashi et al.

It is certified that error appears in the above-identified patent and that said Letters Patent is hereby corrected as shown below:

<u>Column 6, claim 4,</u>
Line 22, change "electrode are" to -- electrode is --.

Signed and Sealed this

Twenty-sixth Day of March, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.    : 6,190,953 B1
DATED         : February 20, 2001
INVENTOR(S)   : Igarashi et al.

It is certified that error appears in the above-identified patent and that said Letters Patent is hereby corrected as shown below:

<u>Title page,</u>
Item [73], Assignee, change "Toshibia" to -- Toshiba --.

Signed and Sealed this

Twenty-ninth Day of April, 2003

JAMES E. ROGAN
*Director of the United States Patent and Trademark Office*